US008138583B2

(12) United States Patent
Sriram et al.

(10) Patent No.: US 8,138,583 B2
(45) Date of Patent: Mar. 20, 2012

(54) DIODE HAVING REDUCED ON-RESISTANCE AND ASSOCIATED METHOD OF MANUFACTURE

(75) Inventors: Saptharishi Sriram, Cary, NC (US); Thomas J. Smith, Jr., Raleigh, NC (US); Helmut Hagleitner, Zebulon, NC (US)

(73) Assignee: Cree, Inc., Durham, NC (US)

(*) Notice: Subject to any disclaimer, the term of this patent is extended or adjusted under 35 U.S.C. 154(b) by 344 days.

(21) Appl. No.: 11/675,658

(22) Filed: Feb. 16, 2007

(65) Prior Publication Data

US 2008/0197360 A1 Aug. 21, 2008

(51) Int. Cl.
*H01L 29/15* (2006.01)

(52) U.S. Cl. .......................................... 257/656; 257/77

(58) Field of Classification Search .................. 257/656, 257/E29.336, 77, 623, 622, 601, 603–606, 257/594, 482, 497, 498, 551
See application file for complete search history.

(56) References Cited

U.S. PATENT DOCUMENTS

| | | | |
|---|---|---|---|
| 4,837,176 A | 6/1989 | Zdebel et al. | |
| 4,947,218 A * | 8/1990 | Edmond et al. | 257/77 |
| 4,987,576 A | 1/1991 | Heinen | |
| 5,424,572 A | 6/1995 | Solheim | |
| 5,539,217 A | 7/1996 | Edmond et al. | |
| 5,577,064 A * | 11/1996 | Swirhun et al. | 372/96 |
| 6,544,674 B2 | 4/2003 | Tuller et al. | |
| 6,734,462 B1 | 5/2004 | Shah | |
| 6,879,014 B2 * | 4/2005 | Wagner et al. | 257/458 |
| 6,943,051 B2 | 9/2005 | Augusto et al. | |
| 6,946,717 B2 * | 9/2005 | Hoag et al. | 257/528 |
| 7,091,533 B2 | 8/2006 | Tihanyi et al. | |
| 7,309,903 B2 * | 12/2007 | Tanaka et al. | 257/421 |
| 2002/0153530 A1 * | 10/2002 | Levine et al. | 257/107 |
| 2004/0097021 A1 | 5/2004 | Augusto et al. | |
| 2004/0119129 A1 * | 6/2004 | Giboney | 257/458 |

(Continued)

FOREIGN PATENT DOCUMENTS

EP 0371379 6/1990

(Continued)

OTHER PUBLICATIONS

European Search Report of foreign counterpart application No. EP 08101385 mailed Sep. 17, 2008, 2 pages.

(Continued)

*Primary Examiner* — Wai Sing Louie
*Assistant Examiner* — Bilkis Jahan
(74) *Attorney, Agent, or Firm* — Steven B. Phillips; Moore & Van Allen PLLC

(57) ABSTRACT

A diode structure having a reduced on-resistance in the forward-biased condition includes semiconductor layers, preferably of silicon carbide. The anode and cathode of the device are located on the same side of the bottom semiconductor layer, providing lateral conduction across the diode body. The anode is positioned on a semiconductor mesa, and the sides of the mesa are covered with a nonconductive spacer extending from the anode to the bottom layer. An ohmic contact, preferably a metal silicide, covers the surface of the bottom layer between the spacer material and the cathode. The conductive path extends from anode to cathode through the body of the mesa and across the bottom semiconductor layer, including the ohmic contact. The method of forming the diode includes reacting layers of silicon and metal on the appropriate regions of the diode to form an ohmic contact of metal silicide.

37 Claims, 2 Drawing Sheets

U.S. PATENT DOCUMENTS

| | | |
|---|---|---|
| 2005/0258483 A1 | 11/2005 | Templier et al. |
| 2006/0214221 A1 | 9/2006 | Challa et al. |
| 2006/0220086 A1* | 10/2006 | Charbuillet et al. .......... 257/296 |

FOREIGN PATENT DOCUMENTS

| | | |
|---|---|---|
| EP | 0468136 A3 | 1/1992 |
| EP | 0896738 A1 | 10/1997 |
| EP | 1679748 A2 | 7/2006 |
| FR | 2844099 | 3/2004 |
| JP | 2229460 A | 9/1990 |
| JP | 2001185507 A | 7/2001 |
| JP | 2004111760 A | 4/2004 |
| JP | 2004527107 A | 9/2004 |
| WO | 9505006 | 2/1995 |
| WO | 9611499 | 4/1996 |
| WO | 9737389 | 10/1997 |
| WO | 02061836 | 8/2002 |

OTHER PUBLICATIONS

Kittle et al, Self-aligned Ti and Co silicides for high performance sub-0.18 um CMOS technologies; Elsevier, Thin Solid Films 320 (1998) pp. 110-121.

Choi et al, "Sublithographic nanofabrication technology for nanocatalysts and DNA chips," Journal Vacuum Science and Technology B 21(6), Nov./Dec. 2003, pp. 2951-2955.

Cree, Inc., EP Search Report and Opinion, EP Application No. 08101385.6, dated Sep. 17, 2008, 6 pages.

Cree, Inc., EP Office Action, EP Application No. 08101385.6, dated Apr. 22, 2009, 1 page.

Cree, Inc., Response to EP Office Action, EP Application No. 08101385.6, dated Oct. 23, 2009, 9 pages.

Cree, Inc., Japanese Patent Application No. 2008-033820, Office Action dated Nov. 22, 2011.

* cited by examiner

Prior Art PIN Diode

DIODE HAVING REDUCED ON-RESISTANCE AND ASSOCIATED METHOD OF MANUFACTURE

BACKGROUND

This invention relates to diodes having lower series resistance in the forward-biased condition. The problem addressed herein is that diodes formed of silicon carbide have a much higher series resistance than diodes formed of other materials, such as silicon or gallium arsenide. In particular, a silicon carbide substrate adds significant resistance to the overall device and must be thinned before the diode is ready for use.

Diodes made of silicon carbide, however, are very attractive in radio frequency ("RF") applications, such as high speed RF switches and limiters. The high breakdown strength and high thermal conductivity of silicon carbide enable much higher RF power levels and faster switching speeds than possible with silicon or gallium arsenide technologies. An important requirement in these applications is to obtain a low RF on-resistance in the forward biased condition to minimize RF losses.

For example, the on-resistance of PIN diodes mainly consists of two components—one due to the intrinsic layer (the "I-layer") and the other due to the series resistance, Rs, of the substrate. The forward biased I-layer resistance is approximately proportional to the square of the thickness of this layer and is small in SiC devices due to the thin I-layer needed for a required breakdown voltage. The substrate series resistance, however, in silicon carbide diodes is much higher than that of silicon or gallium arsenide due to the higher substrate resistivity of silicon carbide.

Currently, the minimum achievable resistivity in SiC is 15 milliohms-cm (mΩ-cm), which cannot be reduced further without creating defects due to fundamental material properties. Due to this limitation, it is necessary to thin the SiC substrate to about 50-100 μm to achieve an acceptable on-resistance. Thinning the substrate, however, to such low values is undesirable due to the complicated processes involved and the associated yield loss.

The assignee of the invention herein has previously patented multiple techniques for forming diodes in semiconductor materials, such as U.S. Pat. No. 4,947,218 (Edmond 1990), the contents of which are incorporated herein by reference. Other entities have also patented diodes in silicon carbide, some focusing on the use of new materials in forming the contacts thereon. See, e.g., U.S. Pat. No. 6,544,674 (Tuller 2003).

In one attempt at minimizing the series resistance, U.S. Pat. No. 7,091,533 (Tihanyi 2006), discloses a Schottky diode with contacts on the same side of a semiconductor substrate. Tihani, however, fails to show any means by which the lateral current from anode to cathode can be controlled for optimal performance and offers no improvements in series resistance. Similarly, published U.S. Patent Application No. 2004/0097021 (Augusto) discloses photodiodes formed on active areas of standard CMOS devices. Augusto uses a common silicide layer to connect ohmic contacts between a PIN diode and other elements of the circuit. The Augusto patent application, however, does not disclose any relationship between the silicide layer and reducing the on resistance of the PIN diode. Neither of these prior publications directly addresses the presently claimed technique for reducing series resistance in devices formed of silicon carbide.

A need continues to exist in the art of semiconductor diodes, therefore, for reducing the on-resistance of silicon carbide devices under forward bias.

BRIEF SUMMARY OF THE INVENTION

In one aspect, the invention is a diode structure (20) having a reduced on-resistance in the forward-biased condition due to the anode (21) and cathode (30) contacts being located on the same side of the first doped semiconductor layer (35) within the device (20). The diode (20) includes semiconductor layers, preferably of silicon carbide, having different doping profiles. The anode (21) and cathode (30) are located on the same side of the bottom semiconductor layer (35), allowing for lateral conduction across the diode body. The anode (21) is positioned on a semiconductor mesa (22). The cathode (30) is laterally separated from the mesa (22) across the first semiconductor layer (35).

Having anode and cathode contacts on the same side of the active layers within the above-described diode could lead to the problem of unwanted conduction along the side of the mesa (22). To remedy this, the sides of the mesa (22) are covered with a nonconductive spacer (24) extending from the anode (30) to the surface of the layer on which the cathode (25) is located. Overall, surface passivation helps in controlling electronic properties within the device.

The diode (20) has a reduced on-resistance due, in part, to an ohmic contact, preferably formed of a metal silicide, covering the surface of the bottom layer (35) between the spacer material (24) and the cathode (30). Overall, the conductive path of the diode extends from anode (21) to cathode (30) through the body of the mesa (22) and across the bottom semiconductor layer (35). The layers of the diode herein are preferably formed of silicon carbide.

In another aspect, the method of forming the diode includes standard techniques of forming layered semiconductor devices, doping the layers appropriately, and etching the mesa. The method herein, however, also includes reacting layers of silicon and metal on the appropriate regions of the diode to form ohmic contacts of metal silicide.

DETAILED DESCRIPTION

The invention herein addresses the problem of forming a power diode with a desirably low series resistance in the on-state with a simultaneous high voltage blocking ability in the reverse-biased mode. Instead of requiring the current to flow from top to bottom in a vertically conductive channel, the diode of this invention utilizes lateral conduction from a top contact to a second contact on the same side of the diode. This new construction is particularly useful for diodes formed of silicon carbide.

Figure 1:
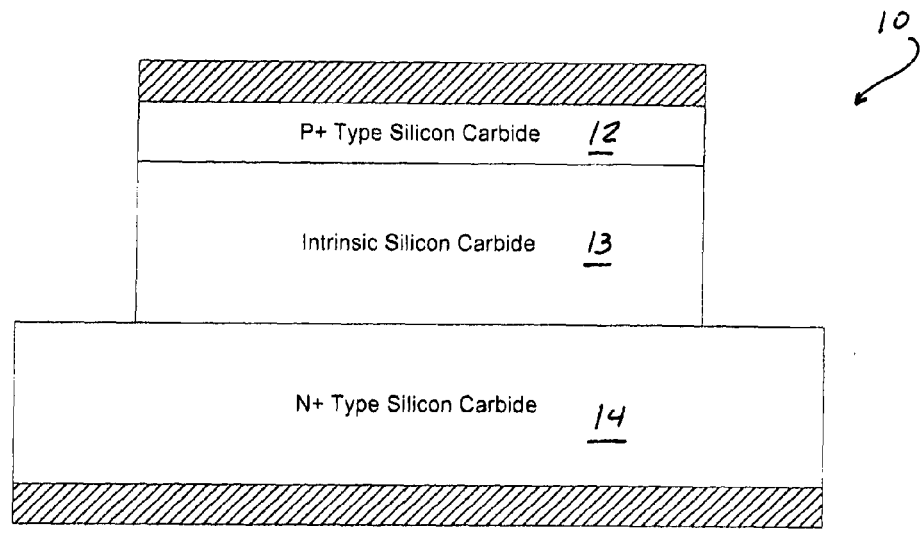
FIG. 1 is a cross-section view of a prior art PIN diode.

FIG. 1 shows a prior art PIN diode (10) for comparison purposes. This prior diode (10) includes highly doped p and n type (12, 14) layers with an intrinsic undoped layer (13) positioned between the two. Series resistance is a problem for the diode of FIG. 1, however, due to the resistance of the silicon carbide substrate through which the current must flow.

Figure 2:
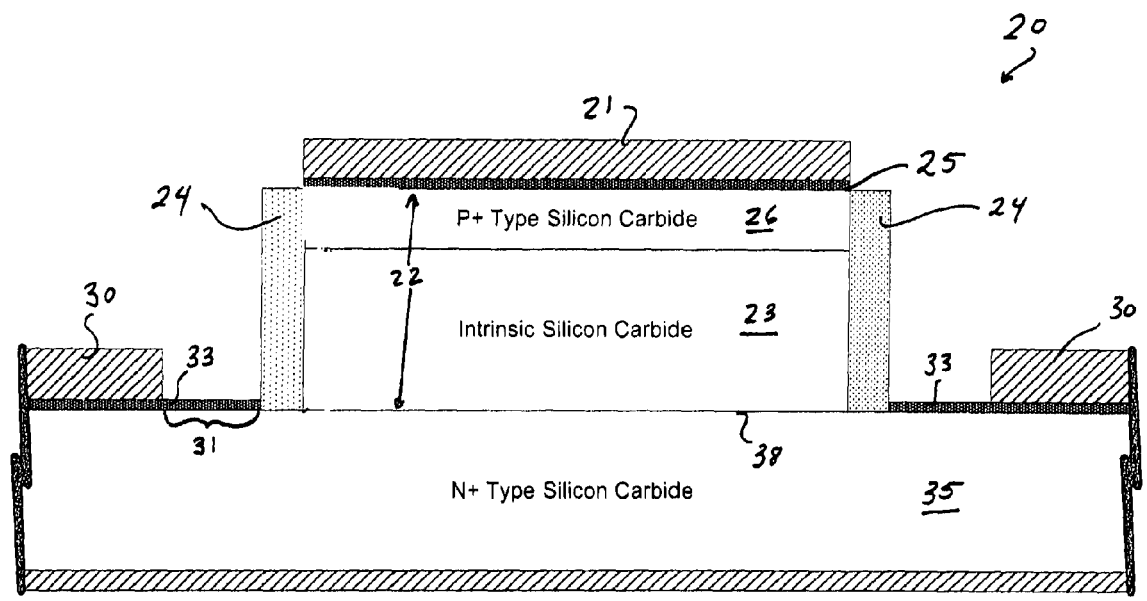
FIG. 2 is a cross-section view of a laterally conductive PIN diode as set forth below.

FIG. 2 shows a new PIN diode (20) pursuant to this invention. In the diode (20), the current flows from the anode (21) located at the top of a p+ type region (26), to the cathode (30) located on the same side of a highly doped bottom layer, referred to herein as the n+ layer (35). This diode (20), therefore, takes advantage of lateral conduction within the n+ layer (35). Without limiting the invention herein, lateral conduction includes the movement of carriers across the n+ layer (35) from one side to the other, as opposed to vertical conduction from top to bottom.

The laterally conductive diode (20) according to this invention has a layered construction that is typical in diode technology. This detailed description discusses the diode (20) construction as having one layer "on" other layers. The term "on" should be construed broadly to encompass designs that include layers between other layers. This invention, therefore, is not limited to a construction in which a layer "on" another layer requires that the layers be directly adjacent. Furthermore, for clarity, this detailed description refers to specific doping types without limiting the possibility of reverse types in any given layer.

As shown, for example, in FIG. 2, the new diode (20) uses lateral conduction across an n+ type doped semiconductor layer (35) having a first surface (38). A semiconductor mesa (22) is on the first surface of the n+ type layer (35) for forming the device junction. In a preferred embodiment, the mesa (22) is a semiconductor layer having an intrinsic silicon carbide layer, the I-layer (23). The mesa (22) also includes a highly doped p+ layer (26) on the I-layer (23). The diode includes a top ohmic contact (25) on the p+ layer (26). The top ohmic contact (25) is preferably a metal silicide supporting a thicker metal anode (21) on the overall mesa (22).

The diode (20) provides a significantly lower forward resistance in the on-state than prior diodes. This lower forward resistance is due, in part, to a cathode (30) on the first surface (38) of the n+ type layer (35). The cathode (30) is positioned adjacent but separated from the mesa (22) on the first surface (38), defining a gap (31) on the first surface (38) between the mesa (22) and the cathode (30). By placing the cathode (30) on the same side of the n+ layer as the anode (21), the diode (20) advantageously uses a shorter path for the current to flow across the n+ layer (35) toward the cathode (30), as opposed to current flowing through the thickness of the substrate of the prior art device in FIG. 1. The cathode (30) can be either a standard metal deposit of a desired thickness or a conductive via.

In the most preferred embodiment, the n+ layer (35) is preferably formed of silicon carbide. With current flowing from the anode (21) toward the n+ layer (35), there is a tendency for unwanted conduction along the side of the mesa (22) down toward the n+ layer (35) and the cathode (30). The conduction down the side of the mesa (22) hinders proper control of the diode (20) because the current bypasses the bulk of the mesa (22). To remedy this short-circuit, the diode (20) incorporates a nonconductive mesa sidewall spacer layer (24) within a portion of the gap (31) on the first surface (38). The sidewall spacer (24) covers the side of the mesa (22) from the first surface (38) of the n+ layer (35) to the top of the mesa (22). The sidewall spacer (24) improves passivation and thereby improves the electronic properties of the interface between the layers.

To ensure that the series resistance within the diode is minimal, while allowing the diode to function as intended, the diode (20) has a lateral ohmic contact (33) covering at least a portion of the first surface (38) of the n+ layer (35). The lateral ohmic contact (33) extends from the mesa (22) across the top surface (38) of the n+ layer (35). Like the top ohmic contact (25), the lateral ohmic contact (33) is preferably a metal silicide. The cathode (30) is a thicker layer of metal on the metal silicide. The lateral ohmic contact (31) allows the diode (20) to conduct a current from the anode (21) to the cathode (30), laterally across the n+ layer (35) and along the lateral ohmic contact (33).

By way of example and without limiting the possibilities for development of other materials, both the top ohmic contact (25) and the lateral ohmic contact (33) are preferably formed of a metal silicide. Using metal silicides for contact points is generally known in the art of semiconductor electronics. Using a metal silicide as the lateral ohmic contact (33) between a diode mesa (22) and cathode (30), however, is a new development in the context of a laterally conductive diode with the contacts on the same side of the n+ layer (35). The metal silicide may be any one of the common silicides, such as titanium silicide, cobalt silicide, or nickel silicide. In a preferred embodiment, the top ohmic contact (25) and the lateral ohmic contact (31) are formed of etched metal silicide so that the top ohmic contact is self-aligned to the mesa. This does not preclude, however, embodiments in which the top ohmic contact and the lateral ohmic contact are made of different materials.

The diode construction of this invention will typically include p-type and n-type layers forming the device junction. The construction described herein is particularly advantageous in forming a PIN diode. To form a PIN structure, the diode (20) incorporates an additional semiconductor layer within the mesa (22). This additional layer is an intrinsic semiconductor layer (28) between a heavily doped top p-type layer (26) and the n+ type layer (35). Of course, the doping types of the layers could be reversed as necessary.

The diode (20) does not utilize standard vertical conduction from the top contact to a bottom contact. The diode, however, may include a bottom contact (40) for mounting the diode into a circuit. The bottom contact is typically on the side of an n+ layer (35) opposite the mesa (22).

Figure 3:
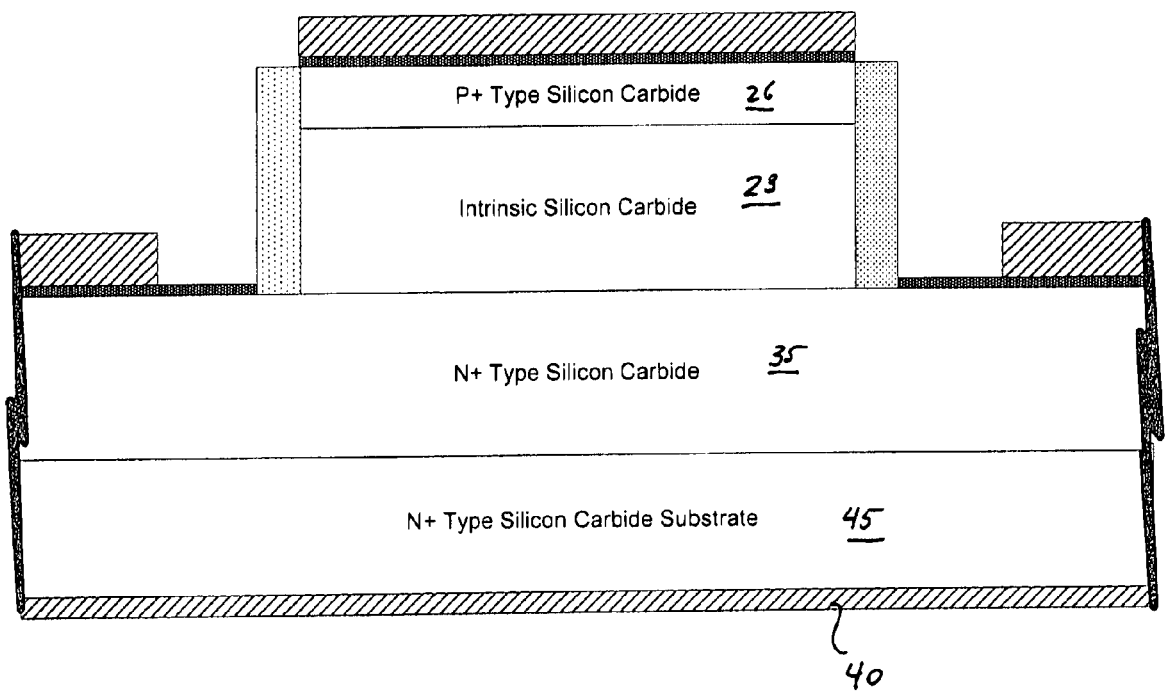
FIG. 3 is a cross-section view of a laterally conductive PIN diode formed on a semi-insulating substrate.

As shown in FIG. 3, the diode (20) may be formed on a semi-insulating substrate (45) to which the bottom contact (40) is affixed. The substrate (45) allows for ease of integration into a wider variety of devices.

The diode describe above results from an improved method of diode manufacturing, set forth as follows. The first step in developing the diode (20) is forming a semiconductor mesa (22) on a first surface (38) of a first doped semiconductor layer (35) that is highly doped to a first conductivity type, e.g., n+ in FIG. 2. For a PIN diode, the mesa includes an intrinsic or I-layer (23) and a highly doped region of opposite conductivity type at the top of the mesa, e.g. p+ region (26) in FIG. 2. The process of forming semiconductor mesas with doped layers on a substrate is known and commonly used in silicon carbide technology. Doping can be achieved during epilayer growth. The mesa (22), for example, can be formed from a dry etch of an epitaxial layer formed on the substrate. In the example of FIG. 2, the n+ layer (35) is highly doped with an n-type dopant within a range of 5E18 to 2E19. The epilayer mesa (22) includes a region (26) of p+ type doping greater than ~1E20.

Next, a nonconductive spacer material (24), such as silicon dioxide or silicon nitride, is deposited on at least one side of the mesa (22) from the top of the mesa (22) to the exposed surface of a lower layer (35), forming at least one sidewall spacer (24) for preventing short circuiting within the diode. The method includes depositing the spacer material over the device (20) and then etching the spacer material so that the spacer material only covers the sides of the mesa. After forming the sidewall spacer (24) on the mesa (22), the method includes forming a lateral ohmic contact (33) from the sidewall spacer (24) across the first surface (38) of the first doped layer (35). The material used to form the lateral ohmic contact material (33) may also cover the top of the mesa (22) to create the top ohmic contact (25). The method may optionally include using a self-aligning technique for forming the top contact (25) on the mesa (22). Self-aligning includes etching the top ohmic contact so that the edges thereof coincide with the edges of the sidewall spacer (24). In that case, the top contact (25) and the lateral ohmic contact (33) will be made of identical materials. The invention herein also encompasses those embodiments in which the top ohmic contact (25) and the lateral ohmic contact (33) are made of different but equally effective ohmic materials.

To complete the conduction path, a cathode (30) is formed on the first doped layer (35) over the lateral ohmic contact (33). An anode (21) is formed on the mesa (22) over the top ohmic contact (25). The cathode (30) is, therefore, electrically connected to the lateral ohmic contact (33) on the first doped layer (35) so that the diode conducts a current from the anode (21) to the cathode (30) in a conductive path that extends laterally across the first doped layer (35).

The above noted step of forming the lateral ohmic contact (33) includes, but is not limited to, reacting silicon and a conductive metal on the surface (38) of a first n+ type layer (35) between the sidewall spacer (24) and the cathode (30). The lateral ohmic contact (33), therefore, may be a metal silicide formed by first depositing a layer of silicon over the first semiconductor layer (35), the mesa (22), and the sidewall spacer (24). This step may include using thermal and e-beam evaporation to deposit the silicon.

To prevent short-circuiting from anode to cathode, the silicon on the sidewall spacer must be removed so that no metal silicide is formed on the vertical rise of the mesa (22). For example, an isotropic dry etch is effective in removing the silicon from the sidewall of the mesa (22). The sidewall spacer is vertically oriented and the amount of silicon deposited thereon is much less than the silicon on the horizontal top surface (38) of the n+ layer (35). Given that the layer of silicon on the sidewall spacer (24) is much thinner, the silicon deposited on the sidewall spacer (24) may be removed by etching.

Afterwards, a conductive metal is deposited or sputtered over the mesa (22), the sidewall spacer (24) and at least a portion of the silicon covering the first semiconductor layer (35). The method herein encompasses heating the silicon and metal to a temperature sufficient to react the silicon with the conductive metal. In one embodiment, the diode structure is heated to a temperature between about 300° and 400° Celsius to form a lateral ohmic contact (33) of metal silicide from the sidewall spacer (24) across the surface (38) of the n+ layer (35). In a preferred embodiment, the heating causes the same reaction to form the top ohmic contact (25) on the mesa (22). Temperatures up to 600° Celsius can be used to achieve the silicon-metal reaction.

Again, currents down the sidewall spacer (24) are undesirable, and the conductive metal is removed from the sidewall spacer (24). In one embodiment, the silicide is a nickel silicide, and a standard nickel etch will remove the nickel from the sidewall spacer (24) without affecting the metal silicide or the material forming the sidewall spacer.

As a final step, the diode is heated to a temperature of about 800 degrees Celsius to achieve a better silicide-semiconductor contact with a low sheet resistance. As noted above, this method may be practiced by forming the diode (20) on a semi-insulating substrate (45) and placing a bottom contact (40) on the substrate (45) for mounting.

The following table shows the simulated results of model diodes designed according to this invention. The series resistance in laterally conductive diodes is significantly reduced, even with substrates as thin as 50 microns:

| Substrate Thickness | Rs in Vertically Conductive Diode with Bottom Contact | Rs in Laterally Conductive Diode with Topside Contacts |
|---|---|---|
| 50 μm | 0.42 'Ω | 0.28 'Ω |
| 100 μm | 0.53 'Ω | 0.29 'Ω |
| 300 μm | 0.72 'Ω | 0.29 'Ω |

The method described herein may be used to form a variety of diodes that will have significantly improved performance via lateral conduction. The step of forming the mesa (22), therefore, may comprise forming an n− type doped semiconductor layer on an n+ type doped first layer so that the diode is a Schottky diode. Likewise, the step of forming the mesa may comprise forming an intrinsic semiconductor layer on an n+ type first semiconductor layer and forming a p+ type doped semiconductor layer on the intrinsic layer so that the diode is a PIN diode. The PIN diode according to this invention has been discussed at length above.

The embodiments described above do not require any particular dimensions for the top ohmic contact (25), the lateral ohmic contact (33), or the sidewall spacer (24). Although the drawings show the ohmic contacts (25, 33) as extending all the way from the sidewall spacer (24) in either direction, such drawings do not limit the invention. In fact, the ohmic contacts (25, 33) may extend across the appropriate semiconductor surface and leave gaps of exposed semiconductor. In other words, the ohmic contacts (25, 33) do not have to actually touch the sidewall spacer (24) region. In this embodiment, the ohmic contacts (25, 33) would cover only a portion of their respective semiconductor layers and would not be directly adjacent the sidewall spacer (24).

Those having skill in the art will recognize that the invention may be embodied in many different types of device structures. Accordingly, the invention is not limited to the particular structures illustrated herein.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:
1. A laterally conductive diode comprising:
a first doped semiconductor layer having a first surface;
a semiconductor mesa on said first surface of said first doped layer, said semiconductor mesa comprising an intrinsic semiconductor region and a region having a different conductivity type from said first doped layer, wherein said intrinsic semiconductor region is located between said first doped semiconductor layer and said region having a different conductivity type;
a top ohmic contact on said mesa;
a nonconductive mesa sidewall spacer only on a side of said mesa between said first surface of said first doped layer and the top of said mesa; and
a lateral ohmic contact extending across at least a portion of said first surface of said first doped layer, said lateral ohmic contact conducting a current from said top ohmic contact laterally across said first doped layer.

2. A laterally conductive diode according to claim 1, wherein said lateral ohmic contact extends from said sidewall spacer.

3. A laterally conductive diode according to claim 2, wherein said first doped layer is of n+ doping type.

4. A laterally conductive diode according to claim 3, wherein said region of different conductivity type is of p+ doping type.

5. A laterally conductive diode according to claim 1, wherein said top ohmic contact extends across said mesa to a position adjacent said sidewall spacer.

6. A laterally conductive diode according to claim 1, further comprising a conductive metal cathode on said lateral ohmic contact.

7. A laterally conductive diode according to claim 1, further comprising a conductive metal anode on said top ohmic contact.

8. A laterally conductive diode according to claim 1, wherein said top ohmic contact comprises a metal silicide.

9. A laterally conductive diode according to claim 8, wherein said metal silicide is selected from the group consisting of $TiSi_2$, $CoSi_2$, and $Ni_2Si$.

10. A laterally conductive diode according to claim 1, further comprising a conductive metal cathode on said lateral ohmic contact.

11. A laterally conductive diode according to claim 10, wherein said metal silicide is selected from the group consisting of $TiSi_2$, $CoSi_2$, and $Ni_2Si$.

12. A laterally conductive diode according to claim 1, wherein said first doped semiconductor layer comprises silicon carbide.

13. A laterally conductive diode according to claim 1, wherein said semiconductor mesa comprises silicon carbide.

14. A laterally conductive diode according to claim 1, wherein said first doped layer is on a semi-insulating substrate.

15. A laterally conductive diode according to claim 14, wherein said semi-insulating substrate is a silicon carbide substrate.

16. A laterally conductive diode according to claim 14, further comprising a bottom contact on the side of said substrate opposite said n+ layer for mounting the diode in a circuit.

17. A PIN diode comprising:
an n+ type doped semiconductor layer having a first surface;
an intrinsic semiconductor layer on said first surface of said n+ semiconductor layer for controlling the current through the diode;
a p+ semiconductor layer on said intrinsic layer opposite said n+ type doped semiconductor layer;
a top ohmic contact on said p+ type semiconductor layer;
a lateral ohmic contact on said first surface of said n+ type semiconductor layer, said lateral ohmic contact positioned proximate to said intrinsic layer and said p+ layer, wherein the PIN diode conducts a current from said top ohmic contact to said lateral ohmic contact across said n+ layer; and
a sidewall spacer on at least one side of both said intrinsic layer and said p+ layer, wherein said sidewall spacer is limited to the side or sides of both said intrinsic layer and said p+ layer and faces said lateral ohmic contact to prevent short circuiting between said top ohmic contact and said lateral ohmic contact.

18. A PIN diode according to claim 17, further comprising a cathode on said lateral ohmic contact.

19. A PIN diode according to claim 17, wherein said lateral ohmic contact is a metal silicide.

20. A PIN diode according to claim 19, wherein said metal silicide is selected from the group consisting of $TiSi_2$, $CoSi_2$, and $Ni_2Si$.

21. A PIN diode according to claim 17, wherein said top ohmic contact is a metal silicide.

22. A PIN diode according to claim 21, wherein said metal silicide is selected from the group consisting of $TiSi_2$, $CoSi_2$, and $Ni_2Si$.

23. A PIN diode according to claim 17, wherein said sidewall spacer is selected from the group consisting of silicon dioxide and silicon nitride.

24. A PIN diode according to claim 23, further comprising a bottom contact on the side of said substrate opposite said n+ layer for mounting the PIN diode in a circuit.

25. A laterally conductive diode according to claim 17, wherein said lateral ohmic contact extends from said sidewall spacer.

26. A laterally conductive diode according to claim 17, wherein said top ohmic contact extends across said mesa to a position adjacent said sidewall spacer.

27. A PIN diode according to claim 17, wherein said n+ type doped semiconductor layer comprises silicon carbide.

28. A PIN diode according to claim 17, wherein said intrinsic semiconductor layer comprises silicon carbide.

29. A PIN diode according to claim 17, wherein said p+ semiconductor layer comprises silicon carbide.

30. A PIN diode according to claim 17, wherein said n+ layer is on a silicon carbide substrate.

31. A laterally conductive diode comprising:
a first doped semiconductor layer having a first surface;
a semiconductor mesa on said first surface of said first doped layer;
a top ohmic contact on said mesa;
a nonconductive mesa sidewall spacer only on a side of said mesa between said first surface of said first doped layer and the top of said mesa; and
a lateral ohmic contact extending across at least a portion of said first surface of said first doped layer, said lateral ohmic contact conducting a current from said top ohmic contact laterally across said first doped layer.

32. A laterally conductive diode according to claim 31, wherein said lateral ohmic contact extends from said sidewall spacer.

33. A laterally conductive diode according to claim 31, wherein said top ohmic contact extends across said mesa to a position adjacent to from said sidewall spacer.

34. A laterally conductive diode according to claim 31, wherein said first doped semiconductor layer comprises an n+ type semiconductor and wherein said semiconductor mesa comprises an n− doping type semiconductor.

35. A laterally conductive diode according to claim 31, wherein said first doped semiconductor layer comprises silicon carbide.

36. A laterally conductive diode according to claim 31, wherein said semiconductor mesa comprises silicon carbide.

37. A laterally conductive diode according to claim 31, wherein said semiconductor mesa comprises a region having less doping than said first doped semiconductor layer.

* * * * *